United States Patent [19]
Hughes

[11] Patent Number: 5,812,121
[45] Date of Patent: Sep. 22, 1998

[54] CASCODE CURRENT UNITS WITH INVERTER CIRCUITRY CONTROL

[75] Inventor: Peter William Hughes, Westbury-on-Trym, England

[73] Assignee: SGS-Thomson Microelectronics Limited, Bristol, England

[21] Appl. No.: 397,840

[22] Filed: Mar. 2, 1995

[30] Foreign Application Priority Data

Mar. 2, 1994 [GB] United Kingdom .................... 9404013

[51] Int. Cl.⁶ ............................................. H03M 1/66
[52] U.S. Cl. .......................... 345/211; 341/136; 341/144
[58] Field of Search .................... 345/211, 199, 345/147, 150, 89; 341/133, 135, 136, 144–145; 348/657, 673; 327/108, 210, 310, 391, 413, 437

[56] References Cited

U.S. PATENT DOCUMENTS

| | | | |
|---|---|---|---|
| 4,418,359 | 11/1983 | Stapleton | 348/657 |
| 4,642,690 | 2/1987 | Hinn | 348/673 |
| 4,999,586 | 3/1991 | Meyer et al. | 327/310 |
| 5,343,221 | 8/1994 | Arakawa et al. | 345/211 |
| 5,369,402 | 11/1994 | Kwon | 341/136 |
| 5,442,355 | 8/1995 | Cummins | 341/145 |
| 5,442,379 | 8/1995 | Bruce et al. | 345/199 |
| 5,489,902 | 2/1996 | Shyu et al. | 341/136 |
| 5,548,288 | 8/1996 | Lueng | 341/136 |
| 5,555,000 | 9/1996 | Sarrasin et al. | 345/147 |

*Primary Examiner*—Mark R. Powell
*Attorney, Agent, or Firm*—David V. Carlson; Seed and Berry LLP

[57] ABSTRACT

An output current unit comprises a cascode circuit having a first transistor connected between a voltage supply line and complementary outputs. Second and third transistors are controlled by inverter circuitry having parallel conducting paths between an output node and a ground line, the parallel conducting paths having different current carrying capacity with control circuitry to switch the stronger of the current carrying paths.

13 Claims, 3 Drawing Sheets

CASCODE CURRENT UNITS WITH INVERTER CIRCUITRY CONTROL

The invention relates to apparatus and methods for generating controlled current outputs and to inverter circuitry for use with output current units. The invention also relates to digital to analog converters and video displays incorporating such current generating apparatus.

BACKGROUND OF THE INVENTION

Digital to analog converters for use in video display systems comprise a plurality of output current units arranged to be switched on in response to a digital input signal and produce a required analog current output representing respectively red, green and blue signal levels. It is desirable that such digital to analog converters include current units which provide analog current output values accurately reflecting the digital input and maintain the required output currents with variation in the output voltage which may be needed to meet the compliance specification for the video DAC.

Known current units for use in such DACs have used a cascode circuit in which two transistors are connected in series between a voltage supply line and an output of the current unit, the two transistors being arranged to conduct in saturation so as to provide a very large output resistance and thereby current stability with variation in the output voltage. To control switching of such current units known systems have incorporated matched and complementary steering transistors acting as switches in series with the cascode transistors between the supply voltage line and the unit output. The switching transistors have been arranged to receive simultaneous complementary control signals from inverter circuitry so that only one of the steering transistors is switched on at any one time. This provides two complementary outputs from the unit one of which will give the required data values for use by the video display system. While the cascode transistors operate in saturation the steering transistors operate in their linear region.

In MOS technology and particularly in CMOS technology the supply voltages used are gradually being reduced thereby reducing the headroom between a supply voltage VDD and a ground line. With the above mentioned prior art system using steering transistors in series with a cascode circuit between a supply voltage and ground potential problems can arise in providing sufficient voltage across the steering transistors when the supply voltage is reduced below 5 volts.

It is an object of the present invention to provide an improved output current unit using a cascode circuit which may be switched between on and off states and can maintain the cascode transistors in saturation with reduced supply voltage.

It is a further object of the invention to provide an improved current output unit in which cascode transistors remain in saturation while maintaining compliance with variation in output voltage.

It is a further object of the invention to provide improved inverter circuitry for controlling transistors in a cascode circuit.

SUMMARY OF THE INVENTION

The invention provides an output current unit comprising (a) a cascode circuit having a first transistor which is a current magnitude controller arranged to operate in saturation and connected between a first voltage supply and a node, two complementary outputs both of an output voltage different from said first voltage, and second and third transistors connected respectively between said outputs and said node, and (b) inverter circuitry having a digital input to switch selectively the current unit on or off, and outputs connected to said second and third transistors for supplying complementary output signals for switching said second and third transistors respectively between on and off conditions in dependence on said input, said inverter circuitry comprising circuitry connected between two different voltage lines, one of which is a ground line, and arranged to generate high or low output signals in dependence on said input signal, said low output signal having a voltage offset from said ground line, said second and third transistors being arranged to operate in saturation when switched to an on condition whereby one or other of said second and third transistors is switched on and provides with said first transistor a cascode circuit of controlled current output.

References to high and low signals are relative to ground potential which is considered low. The high signal may have a positive or negative value in relation to ground.

Preferably each of said second and third transistors has respective inverter circuitry and in which each said inverter circuitry comprises first transistor circuitry connected between a node and a voltage supply line, second transistor circuitry connected between said node and a ground line, said node being connected to the output and said input being connected to both said first transistor circuitry and to said second transistor circuitry and arranged to switch on selectively either said first or second transistor circuitry in dependence on said input and thereby pull said node towards said voltage supply line or towards ground, said second transistor circuitry including first and second parallel conducting paths between said node and the ground line, the first conducting path including a weak transistor of low current carrying capacity and said second conducting path comprising a strong transistor of larger current carrying capacity, control circuitry being connected to said strong transistor to switch off said strong transistor when said node has fallen to a voltage value close to said ground line.

Preferably said first transistor circuitry includes first and second parallel conducting paths between said node and the voltage supply line, the first conducting path including a weak transistor of low current carrying capacity and said second conducting path comprising a strong transistor of larger current carrying capacity.

Preferably two inverter circuits are arranged to receive respectively simultaneous complementary digital signal inputs, said output of each inverter circuit being connected to said control circuitry o f the other inverter circuit thereby providing a delayed signal to control switching off said strong transistor connected to the ground line of each second conducting path.

The invention also provides a digital to analog converter including a plurality of output current units as aforesaid. The invention includes a video display system having such a digital to analog converter.

The invention also provides an output current unit comprising (a) a cascode circuit having a first transistor which is a current magnitude controller arranged to operate in saturation and connected between a first voltage supply of less than 5 volts and a node, two complementary outputs both of an output voltage different from said first voltage, and second and third transistors connected respectively between said outputs and said node, each of said first and second and third transistors comprising a MOS device, and (b) inverter circuitry for generating complementary gate control signals for switching one of said second and third transistors on while the other is off, said second and third transistors thereby acting as switches controlling the two complementary outputs and both arranged when on to conduct in saturation thereby forming with said first transistor a cascode circuit of controlled current output.

The invention provides a method of generating a controlled current output from a cascode circuit comprising a first MOS transistor connected between a low voltage supply and a node and, two complementary outputs and second and third MOS transistors connected respectively between said outputs and said node, which method comprises supplying complementary gate control signals to said second and third transistors so that one is switched o n while the other is switched off, and operating said first transistor and one of said second an d third transistors, when on, in saturation with a voltage on said low voltage supply of less than 5 volts.

The invention also provides an inverter circuit having an input for receiving a digital signal level and an output having a high or low value dependent on said input, which circuit comprises first transistor circuitry connected between a node and a voltage supply line, second transistor circuitry connected between said node and a ground line, said node being connected to the output and said input being connected to both said first transistor circuitry and to said second transistor circuitry and arranged to switch on selectively either said first or second transistor circuitry in dependence on said input and thereby pull said node towards said voltage supply line or towards ground, said second transistor circuitry including first and second parallel conducting paths between said node and the ground line, the first conducting path including a weak transistor of low current carrying capacity and said second conducting path comprising a strong transistor of larger current carrying capacity, control circuitry being connected to said strong transistor to switch off said strong transistor when said node has fallen to a voltage value close to said ground line.

DESCRIPTION OF THE PREFERRED EMBODIMENT

Figure 1:
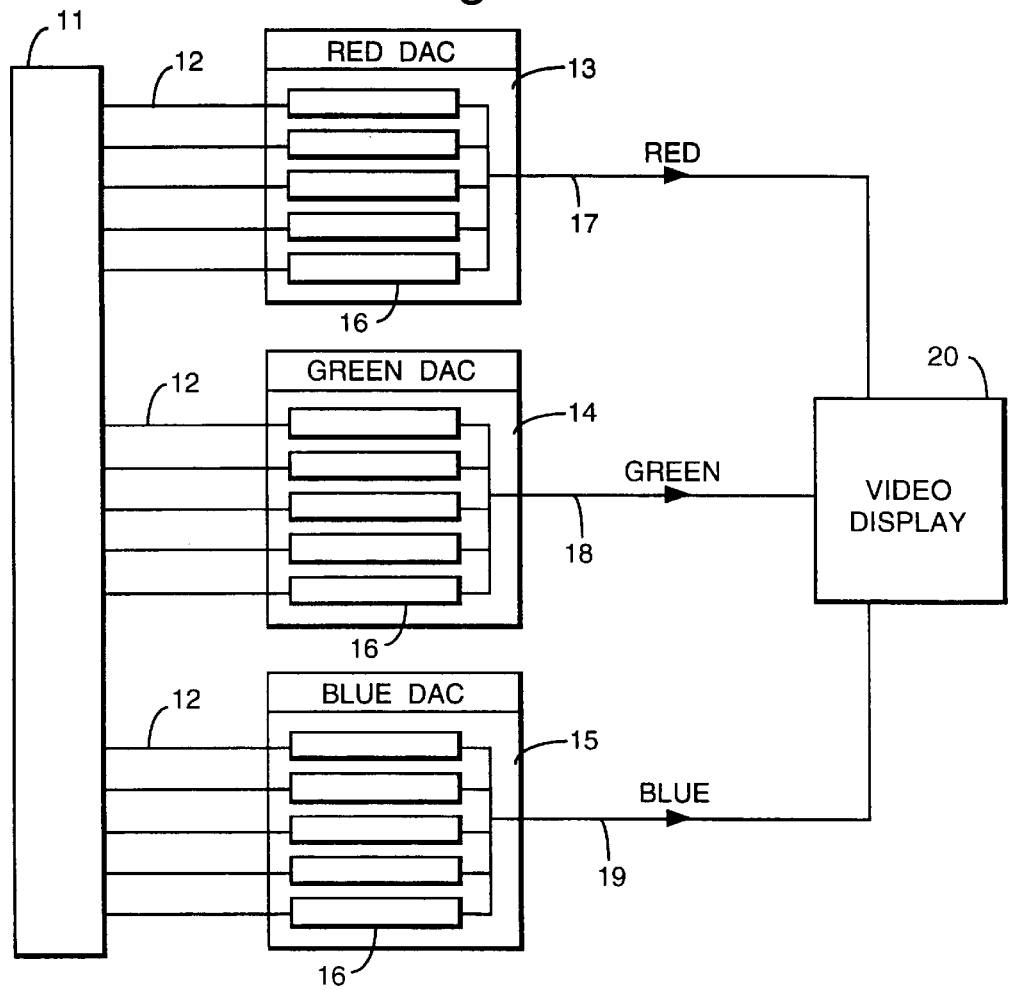
FIG. 1 is a block diagram of a video display system incorporating digital to analog converters in accordance with the present invention.

The video display system shown in FIG. 1 comprises a digital control circuit 11 for generating a plurality of digital signals on lines 12 representing a required video image. The lines 12 are connected as inputs to three digital to analog converters 13, 14 and 15 representing respectively signal values for red, green and blue colours. Each of the digital converters includes a plurality of current units 16 each of similar construction and each coupled to a respective digital input 12. Within each digital to analog converter the outputs of the current units are connected together to an output line 17 for the red signals, 18 for the green signals and 19 for the blue signals. Each of the lines 17, 18 and 19 is connected as an input to a conventional video display 20.

Figure 2:
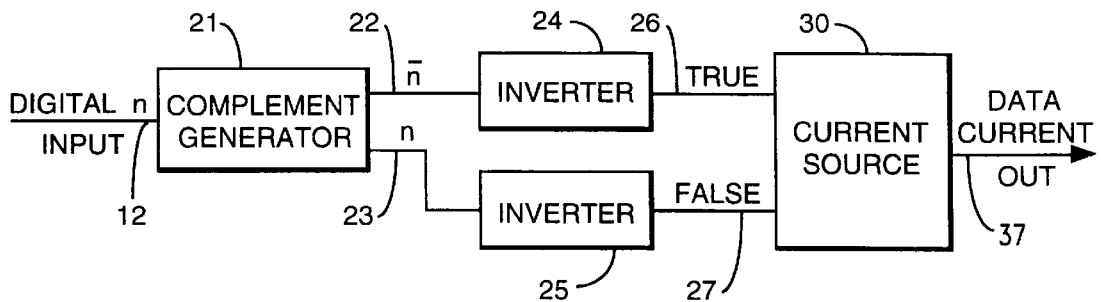
FIG. 2 is a block diagram of one current unit in a digital analog converter of FIG. 1.

FIG. 2 shows in more detail a single current unit 16 from FIG. 1. In this example the input digital signal 12 is represented by the value n. This is fed to a complement generator 21 which has two outputs $\bar{n}$ and n. These signals have the opposite digital value and transitions occur simultaneously on the complementary outputs 22 and 23. Each of the outputs 22 and 23 is fed to a respective inverter 24 and 25 which is arranged to provide a respective output 26 and 27. These outputs 26 and 27 are signal values which are either pulled up or down to two alternative values depending on the input on lines 22 and 23. Alternative structures for the inverters 24 and 25 will be described below with reference to FIGS. 4, 5 and 6. The output of inverter 24 on line 26 is herein referred to as TRUE whereas the output from inverter 25 on line 27 is referred to as FALSE. The current source unit 30 is arranged to receive the complementary inputs 26 and 27 and provide a corresponding analog current output value on line 37 which is connected to one of lines 17, 18 or 19 in FIG. 1.

Figure 3:
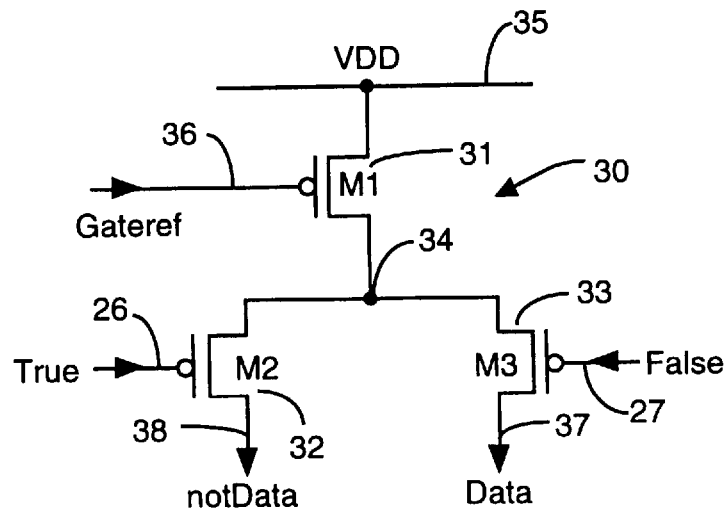
FIG. 3 shows the circuit of a current source for use in FIG. 2.

FIG. 3 shows in more detail the structure of the current source 30 of FIG. 2. This circuit comprises three P-channel MOS transistors 31, 32 and 33. Transistor 31 is connected between a node 34 and a voltage supply line 35 supplying a voltage VDD. This transistor 31 forms a first transistor of a cascode circuit and is arranged to operate in saturation and controls the magnitude of the current output of the circuit 30. The particular value of the current output is determined by a control signal supplied on line 36 to the gate of transistor 31. That signal and the size of the transistor 31 are prearranged to suit the required current output value of the current source. Two complementary outputs 37 and 38 are provided and these are connected respectively through transistors 33 and 32 to the node 34. This thereby provides two branched outputs from the node 34. The gate of transistor 33 is arranged to receive the FALSE input from line 27 whereas the gate of transistor 32 is arranged to receive the TRUE signal from line 26. In the arrangement shown in FIG. 3 using P-channel devices and outputs having voltages less than VDD, transistor 33 is switched on to provide a current output through the data line 37 in response to a digital value 1 on line 12. Consequently the FALSE line 27 fed to the current source 30 represents the requirement for a current output on line 31. When this occurs no current will be output on line 38 as transistor 32 will be switched off by the signal TRUE on line 26.

It will be appreciated that in the arrangement of FIG. 3 whichever of the transistors 32 or 33 is switched on by its gate signal will form a cascode circuit with transistor 31. Transistors 32 and 33 are arranged to operate in saturation when switched on so that when operating as a cascode circuit the circuit has very large output resistance thereby providing a current through the lines 37 or 38 which is substantially independent of the output voltage. This is particularly important for a video DAC where the output voltage will vary depending upon the aggregate current which is output by the DAC. When using the example shown in FIG. 3 the video display may be arranged to respond solely to the current value on the data line 37. The current from line 38 can be sunk to ground. In an alternative arrangement a differential video signal may be generated by using both the outputs 37 and 38. It will be appreciated that using the circuit of FIG. 3 there is improvement in the voltage headroom between the output voltage and the supply voltage on line 35. The voltage drop occurs only across the two transistors forming the cascode circuit at any time. The transistors 32 and 33 fulfill the dual function of replacing the steering transistors in prior art circuits and also act as part of the cascode circuit when switched on. It is therefore possible to operate all transistors in FIG. 3 in saturation when in the on condition even when the voltage of the supply line 35 is reduced to a value below 5 volts. In some MOS technology this supply voltage may drop to a low minimum of 2.7 volts and this is sufficient to maintain the circuit of FIG. 3 in saturation thereby operating as a cascode circuit.

Figure 4:
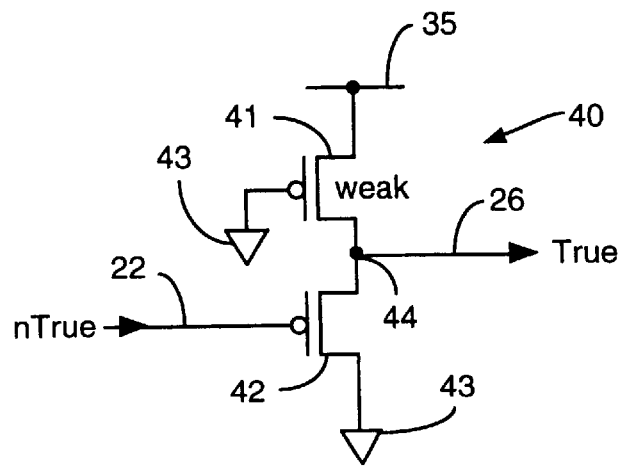
FIG. 4 shows an inverter circuit for use with the current source circuit of FIG. 3.
Figure 5:
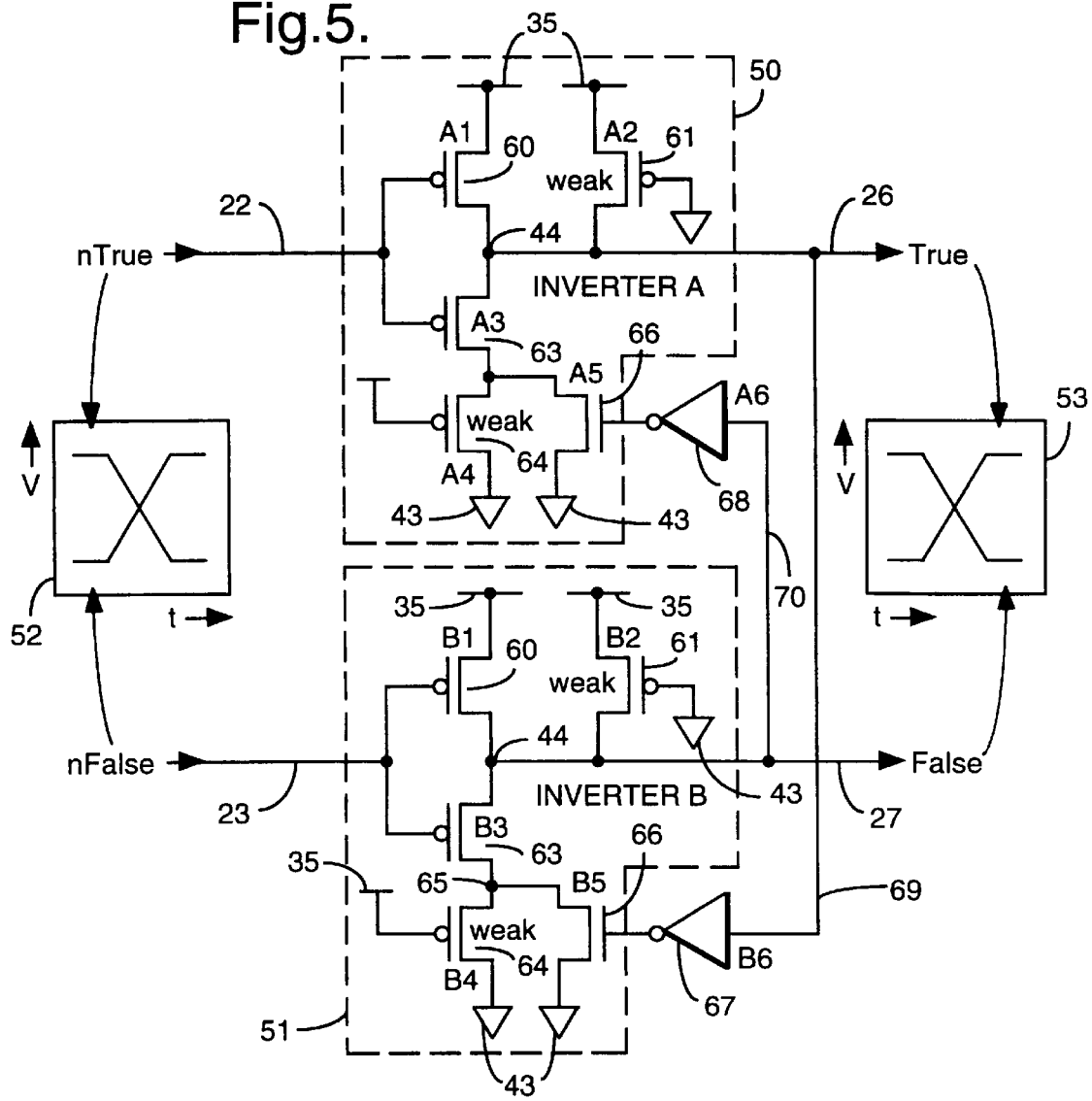
FIG. 5 shows improved inverter circuitry in accordance with the invention and for use with the current source circuit of FIG. 3.
Figure 6:
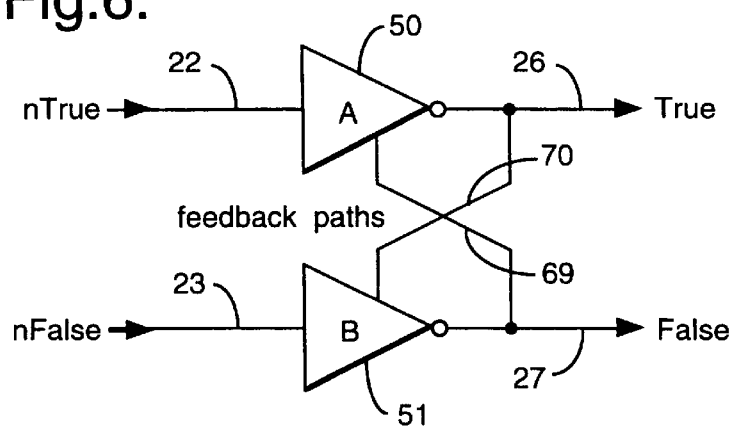
FIG. 6 shows schematically the operation of FIG. 5.

However, some video DAC systems have a compliance specification requiring sufficient rise in voltage on the output lines 37 that problems can arise in maintaining transistor 33 in saturation with rise in voltage on line 37. If the gate signal 27 on line 33 is grounded when the transistor is conducting the transistor can fall out of saturation if the voltage on data line 37 rises to the P-channel threshold voltage. Video DACs may need to operate with an output voltage up to 1.5 volts known as the compliance voltage. This may be 0.2 to 0.3 volts higher than tolerated by standard P-channel process parameters if the transistor 33 is to remain in saturation. The preferred embodiments described with reference to FIGS. 4, 5 and 6 provide inverter circuitry which establishes a voltage signal on lines 26 and 27 which is referenced to ground potential but above ground potential when the respective transistor 32 or 33 is to be switched on. It is desirable to maintain the gate voltage on transistors 32 and 33 close to ground potential as an excessively high on voltage would require the transistors to be excessively large and thereby reduce performance and provide problems in heat dissipation. To switch transistors 32 or 33 into the on condition their gate voltages in this example need be only several hundred millivolts offset from ground potential. This small offset value minimizes the size needed for transistors 32 and 33. In the preferred example these transistors are matched in size and characteristics so that they provide matched circuitry between the node 34 and respective outputs 37 and 38. By use of matched complementary outputs from the node 34 the voltage at that node is held constant during switching of the current source and thereby reduces the problems of glitches in the current output. In the example of FIG. 2 the two transistors 32 and 33 are much smaller than transistor 31 and thereby have minimal effect on the overall magnitude of the current setting. The small size of transistors 32 and 33 is beneficial in providing fast switching in response to high clock rates in the digital inputs to the converters 13, 14 and 15. The switching rate may be as high as 200 Mhz. This corresponds to the video dot rate required by a video display system.

To provide the required gate control signals 26 and 27 for use in FIG. 3 each of the transistors 32 and 33 may be provided with a respective inverter circuit of the type shown at 40 in FIG. 4. In this example a P-channel MOS transistor 41 is connected in series with an n-channel transistor 42 between a voltage supply line 35 (VDD) and ground 43. The input 22 from the complement generator 21 is supplied to the gate transistor 42 which is switched on or off in dependence on the value of signal 22. The output 26 is taken from a node 44 between the transistors 41 and 42. Transistor 41 is a weak transistor in that it has a low current carrying capacity and has its gate connected to ground 43 so that the transistor remains permanently on as a weak current path. Depending on the value of the input signal 22, the transistor 42 may be switched on in which case node 44 is pulled down to ground potential thereby providing an output 26 representing ground potential. If on the other hand transistor 42 is switched off then the current flow through transistor 41 pulls the node 44 towards VDD on line 35 thereby raising the voltage on line 26. When the node 44 has been pulled towards ground potential the two transistors 41 and 42 will act as a potential divider between VDD on line 35 and ground at 43 thereby arranging that the output potential on line 26 is a slight offset above ground potential. This signal 26 may be fed to transistor 32 in FIG. 3. A similar inverter circuit to circuit 40 is provided for transistor 33 and is arranged to input signal 23 from FIG. 2. This will provide the FALSE output 27 which will again be an offset voltage slightly above ground potential when the inverter is switched so as to cause transistor 33 to conduct and provide a current output on data line 37 in FIG. 3. This offset potential above ground on line 27 is of course an offset towards the value VDD on line 35 and is sufficient to maintain transistor 33 in saturation while meeting the compliance voltage variations on the output line 37. It will be understood that the inverter circuitry should provide a low source impedance for generation of the voltage levels needed for the gates of transistors 32 and 33 in order to allow fast switching. On the other hand it is desirable to limit the amount of DC current that is used in the steady state. When using the circuit of FIG. 4 a large amount of quiescent current is needed to allow rapid rise times in the gate signals generated. In order to switch on transistor 33 its gate voltage on line 27 must fall close to ground potential.

Improved inverter circuitry for use with the circuit of FIG. 3 is shown in FIGS. 5 and 6 and permits more rapid change in switching the gate voltages on lines 26 and 27 to a level which switches on the respective transistors 32 and 33 while reducing the current consumption between switching operations. FIG. 5 shows a first inverter circuit 50 which receives signal 22 as a nTRUE input and provides the TRUE output 26. A similar inverter circuit 51 is arranged to receive the nFALSE input 23 and provide the nFALSE output 27. FIG. 5 includes a diagram 52 showing the voltage with time variation of signals on line s 22 and 23 showing that the signals 22 and 23 are complements of each other having simultaneous transitions from high and low levels but in opposite directions. Similarly diagram 53 shows the voltage with time variations of the two outputs 26 and 27 and shows simultaneous transitions on both lines between high and low voltage levels and in opposite directions. The inverter circuit 51 will be considered in detail. Similar reference numerals are used for parts of the circuit corresponding to those previously described in earlier Figures. In this example node 44 which is connected to the output line 27 is connected to the voltage supply line 35 by first transistor circuitry comprising two parallel P-channel MOS transistors 60 and 61. The gate of transistor 60 is connected to the input 23 so that transistor 60 is switched on or off in dependence on the signal value on input 23. Transistor 61 is a weak transistor of low current carrying capacity and has its gate permanently connected to ground 43 so that it provides a permanent low current connection between node 44 and the voltage supply line 35. Node 44 is connected to ground 43 through second transistor circuitry consisting of an n-channel transistor 63 connected directly to the node 44 and a further series connected n-channel transistor 64 connected between transistor 63 and ground 43. Transistor 64 is a weak transistor of low current carrying capacity and has its gate permanently connected to the voltage supply line 35 so as to provide a permanent low current connection between a node 65 and ground 43. Transistor 63 has its gate connected to the input 23 so as to act as a switch either connecting the node 44 to ground 43 or isolating the node 44 from ground. The node 65 is connected by a further n-channel transistor 66 connected in parallel with transistor 64 between the node 65 and ground 43. Transistor 66 is a strong transistor providing a large current carrying path between node 65 and ground 43. When the signal on line 23 switches transistor 60 on and transistor 63 off the node 44 is pulled towards the voltage of supply line 35 thereby giving a high value on the output 27 turning off transistor 33. When the signal on line 23 changes to switch on transistor 63 and transistor 60 is switched off, node 44 is rapidly pulled down towards ground potential by the substantial current path through transistor 63 and transistor 66. This causes a rapid switching rate in signal 27 causing rapid switching on of transistor 33. As soon as switching has occurred it is necessary to reduce the quiescent current flow through the inverter and consequently transistor 66 is switched off by a signal provided by control circuitry in the form of an inverter 67 connected to the gate of transistor 66. The signal from inverter 67 switches off transistor 66 a set delay after the transition in signal levels indicated in the diagram 52. This then allows node 44 to retain the offset voltage value slightly above ground potential and determined by the potential divider effect established by the weak transistor 64, switching transistor 63 and weak transistor 61.

The inverter 50 connected to the input 22 has similar components to those already described for inverter 51 and similar reference numerals have been used for equivalent transistors. The operation of this circuit is exactly the same as that already described for inverter 51. The signal on 26 is rapidly switched towards ground level by a substantial current flow through transistors 63 and 66. A short time after the transition on the input signals 22 and 23 the control circuit provided by an inverter 68 supplies a gate signal to transistor 66 to switch this transistor off thereby minimizing quiescent current flow. The potential on node 44 is maintained at a slight offset from ground potential by the weak current flow through transistors 64, 63 and the weak transistor 61. It will be appreciated that in each of the inverters 50 and 51 it is the change in voltage value on the node 44 which is used to determine the delay in switching off the strong transistors 66. Rather than use the output of node 44 in inverter 51 to switch off transistor 66 in inverter 51 the signal from node 44 of inverter 50 is used. It will be appreciated that to switch off transistor 66 in inverter 51 would require two inversions of the signal derived from node 44 of inverter 51. However by using the signal from node 44 of the other inverter one inversion has already occurred due to the complementary inputs 22 and 23. Consequently only a single inverter 67 or 68 is required to supply a signal of appropriate delay and correct signal sign to switch off the respective transistor 66.

In use of the circuit shown in FIG. 5 the rapid switching caused by the pull down operation of the transistor 66 may initially cause the voltage at node 44 to come very close to ground level but after switching off the strong transistor 66 the voltage at node 44 will resume the required offset from the ground potential due to operation of the potential divider effect of the weak transistors which remain on.

FIG. 6 shows schematically the effect of feeding back an output of each of the inverters as a control signal for control circuitry usable in the other inverter to switch off the strong transistor causing the pull down to ground. The feedback paths in FIG. 6 are marked 69 and 70. The offset voltage achieved by the potential divider effect is approximately 0.2 volts–0.3 volts above ground. The weak transistors in each inverter are arranged to limit the quiescent current flow to approximately 20 amps per current source.

If it is required to quickly disable the inverters power consumption can be minimised by setting the gates of transistors 64 to an off condition.

The invention is not limited to the details of the foregoing examples. Although the examples have been described with P-channel transistors in the cascode circuitry other arrangements may be used involving n-channel transistors in the cascode circuitry. In this case the inverters will arrange suitable offsets from the ground potential to operate the transistors in the cascode circuitry which provide the dual function of acting as steering transistors.

Although FIG. 5 shows the use of weak transistors 61 and 64, the weak transistors could be replaced by resistors as the inverter would use node 44 connected in a potential divider circuit which includes the resistors with the switchable strong transistors 42 or 66 operating to cause rapid change in the node voltage during switching of the input values to the inverters.

I claim:

1. An output current unit comprising (a) a cascode circuit having a first transistor which is a current magnitude controller arranged to operate in saturation and connected between a first voltage supply and a node, two complementary outputs both of an output voltage different from said first voltage, and second and third transistors connected respectively between said outputs and said node, and (b) inverter circuitry having a digital input to switch selectively the current unit on or off, and inverter outputs connected to said second and third transistors for supplying complementary output signals for switching said second and third transistors respectively between on and off conditions based on said digital input, said inverter circuitry comprising circuitry connected between two different voltage lines, one of which is a ground line, and arranged to generate high or low outputs at an output node based on said digital input signal, said low output having a voltage offset from said ground line, two parallel conducting paths of different current carrying capacities interconnecting said output node to said ground line with control circuitry arranged to switch off the higher current carrying path after generation of said low output, said second and third transistors being arranged to operate in saturation when switched to an on condition whereby one or the other of said second and third transistors is switched on and provides, with said first transistor, a cascode circuit of controlled current output.

2. An output current unit as claimed in claim 1 in which each of said second and third transistors is connected to respective said inverter circuitry and in which each said inverter circuitry comprises first transistor circuitry connected between a second node and a voltage supply line, second transistor circuitry connected between said second node and a ground line, said second node being connected to one of the inverter outputs and said digital input being connected to both said first transistor circuitry and to said second transistor circuitry and arranged to switch on selectively either said first or second transistor circuitry based on said digital input and thereby pull said second node towards said voltage supply line or towards ground, said second transistor circuitry including first and second parallel conducting paths between said second node and the ground line, the first conducting path including a weak transistor of low current carrying capacity and said second conducting path comprising a strong transistor of larger current carrying capacity, control circuitry being connected to said strong transistor to switch off said strong transistor when said second node has fallen to a voltage value close to said ground line.

3. An output current unit according to claim 2 in which said first transistor circuitry includes first and second parallel conducting paths between said second node and the voltage supply line, the first conducting path of the first transistor circuitry including a weak transistor of low current carrying capacity and said second conducting path of said first transistor circuitry comprising a strong transistor of larger current carrying capacity.

4. An output current unit according to claim 2 comprising two inverter circuits arranged to receive respectively simultaneous complementary digital signal inputs, each of said inverter outputs being connected to said control circuitry of the other inverter circuit thereby providing a delayed signal to control switching off said strong transistor connected to the ground line of each second conducting path.

5. An output current unit according to claim 4 in which the output of each inverter circuit is connected through a further inverter to provide said delayed signal to the strong transistor connected to the ground line.

6. An output current unit according to claim 2 in which the transistors of said cascode circuit comprise MOS devices.

7. An output current unit according to claim 6 in which the transistors of said cascode circuit comprise P-channel transistors.

8. The output current unit according to claim 1 further including:
a plurality of additional output current units, said current units being connected to respective digital input circuitry to form a digital to analog converter.

9. The output current unit according to claim 8 in which said first voltage supply is less than 5 volts, each of said transistors in said cascode circuit comprise MOS devices and said transistors in the cascode circuit are arranged to operate in saturation, said offset voltage from said ground line being selected to maintain said transistors in saturation with variation in the output voltage of said digital to analog converter.

10. The output current unit according to claim 8, further including:
a digital signal generator for generating digital signals representing colour signal requirements for a video display;

a plurality of respective digital to analog converters each composed of a plurality of said additional output current units for receiving digital input signals and producing a current output signal representing red, green or blue signal values; and a video display connected to receive current values from said digital to analog converters.

11. An output current unit comprising (a) a cascode circuit having a first transistor which is a current magnitude controller arranged to operate in saturation and connected between a first voltage supply of less than 5 volts and a node, two complementary outputs both of an output voltage different from said first voltage, and second and third transistors connected respectively between said outputs and said node, each of said first and second and third transistors comprising a MOS device, and (b) inverter circuitry for generating complementary gate control signals for switching one of said second and third transistors on while the other is off, said second and third transistors thereby acting as switches controlling the two complementary outputs and both transistors arranged when on to conduct in saturation thereby forming with said first transistor a cascode circuit of controlled current output.

12. A method of generating a controlled current output from a cascode circuit comprising a first MOS transistor connected between a low voltage supply and a node and, two complementary outputs and second and third MOS transistors connected respectively between said complementary outputs and said node, which method comprises supplying complementary gate control signals to said second and third transistors so that one is switched on while the other is switched off, and operating said first transistor and one of said second and third transistors, when on, in saturation with a voltage on said low voltage supply of less than 5 volts.

13. A method according to claim 12 in which said control signals are selectively varied between high and low states, said low states having a voltage offset from ground voltage.

* * * * *